(12) United States Patent
Everts et al.

(10) Patent No.: US 12,136,534 B2
(45) Date of Patent: Nov. 5, 2024

(54) VOLTAGE WAVEFORM GENERATOR FOR PLASMA ASSISTED PROCESSING APPARATUSES

(71) Applicant: PRODRIVE TECHNOLOGIES INNOVATION SERVICES B.V., Son en Breugel (NL)

(72) Inventors: Jordi Everts, Son en Breugel (NL); Noud Slaats, Son en Breugel (NL)

(73) Assignee: PRODRIVE TECHNOLOGIES INNOVATION SERVICES B.V., Son en Breugel (NL)

( * ) Notice: Subject to any disclaimer, the term of this patent is extended or adjusted under 35 U.S.C. 154(b) by 125 days.

(21) Appl. No.: 18/005,326

(22) PCT Filed: Jul. 6, 2021

(86) PCT No.: PCT/EP2021/068697
§ 371 (c)(1),
(2) Date: Jan. 12, 2023

(87) PCT Pub. No.: WO2022/013017
PCT Pub. Date: Jan. 20, 2022

(65) Prior Publication Data
US 2023/0260753 A1   Aug. 17, 2023

(30) Foreign Application Priority Data
Jul. 15, 2020  (NL) ..................... 2026071

(51) Int. Cl.
*H01J 37/32*  (2006.01)

(52) U.S. Cl.
CPC ...... *H01J 37/32128* (2013.01); *H01J 37/321* (2013.01); *H01J 37/32146* (2013.01); *H01J 37/32174* (2013.01)

(58) Field of Classification Search
CPC .......... H01J 37/32174; H01J 37/32183; H01J 37/32706; H01J 37/32082;
(Continued)

(56) References Cited

U.S. PATENT DOCUMENTS

| | | | |
|---|---|---|---|
| 9,208,992 B2 | 12/2015 | Brouk et al. | |
| 2010/0321089 A1 | 12/2010 | Choy | |
| 2018/0032100 A1 | 2/2018 | Kim et al. | |

FOREIGN PATENT DOCUMENTS

WO   2020216741 A1   10/2020

OTHER PUBLICATIONS

International Search Report and Written Opinion of the International Searching Authority from the European Patent Office, in PCT/EP2021/068697 dated Oct. 5, 2021, which is an international application corresponding to this U.S. application.

*Primary Examiner* — Monica C King
(74) *Attorney, Agent, or Firm* — Kolitch Romano Dascenzo Gates LLC

(57) ABSTRACT

A voltage waveform generator includes a common node, a voltage waveform generation circuit and a current source. The voltage waveform generation circuit is operably connected to the common node and is configured to apply a voltage signal at the common node. The current source is operably connected to the common node and configured to apply a DC current at the common node. The current source has a first switch node connected to the common node through a first inductor, and a first power supply connected to the first switch node. The power supply includes at least two first voltage nodes, and the current source is operable to switch between the at least two first voltage nodes at the first switch node.

20 Claims, 12 Drawing Sheets

(58) Field of Classification Search
CPC ........... H01J 37/32935; H01J 37/32146; H01J 37/3299; H01J 37/321; H01J 37/32009; H01J 37/32715; H01J 37/32568; H01J 2237/3341; H01J 37/32128; H01J 37/32577; H01J 37/08; H01J 37/32091; H01J 37/32137; H01J 37/32357; H01J 37/32944; H01J 2237/2007; H01J 37/32165; H01J 37/32623; H01J 37/3438; H01J 2237/327; H01J 37/248; H01J 37/3426; H01J 37/3444; H01J 37/3467; H01J 2237/24564; H01J 2237/332; H01J 2237/3321; H01J 2237/334; H01J 37/32027; H01J 37/34; H01J 2237/3322; H01J 37/3053; H01J 37/32045; H01J 37/3244; H01J 37/32477; H01J 37/3255; H01J 37/32697; H01J 37/32917; H01J 2237/002; H01J 2237/004; H01J 2237/3174; H01J 2237/3345; H01J 37/00; H01J 37/32119; H01J 37/32192; H01J 37/32412; H01J 37/32422; H01J 37/32541; H01J 37/32642; H01J 37/32926; H01J 37/3408; H01J 2237/022; H01J 2237/053; H01J 2237/335; H01J 37/05; H01J 37/20; H01J 37/24; H01J 37/244; H01J 37/32018; H01J 37/32036; H01J 37/3211; H01J 37/32155; H01J 37/32284; H01J 37/32449; H01J 37/32458; H01J 37/32522; H01J 37/32532; H01J 37/32559; H01J 37/32587; H01J 37/32678; H01J 37/32724; H01J 37/32779; H01J 37/32834; H01J 37/32871; H01J 37/32889; H01J 37/32899; H01J 37/32972; H01J 37/3405; H01J 37/3441; H01J 37/3455; H01J 49/443; H05H 1/46; H05H 2242/20; H05H 1/4652; H05H 1/466; H05H 1/24; H05H 1/245; H05H 1/2465; H05H 1/4645; H05H 1/4697; H05H 1/54; H05H 3/02

See application file for complete search history.

VOLTAGE WAVEFORM GENERATOR FOR PLASMA ASSISTED PROCESSING APPARATUSES

TECHNICAL FIELD

The present disclosure is related to a voltage waveform generator for a plasma assisted processing apparatus, and to a related method of generating a voltage waveform for use in plasma assisted processing, in particular a voltage waveform for producing a voltage bias across a sheath of the plasma in contact with a substrate to be processed. The voltage bias is advantageously used for controlling the ion energy in plasma assisted etching, plasma assisted layer deposition, or Reactive Ion Etching (REI).

INTRODUCTION

In plasma assisted etching and plasma assisted layer deposition radio frequency (RF) generators are used to generate a bias voltage for controlling the ion energy. To improve process control, accurate control of the bias voltage and the resulting ion energy distribution (IED) is of importance. Generating this bias voltage is typically done with limited efficiency (wideband) linear amplifiers or with limited flexibility (narrowband) switch-mode amplifiers or dedicated pulse generating amplifiers. Typically the amplifiers control the output voltage waveform only indirectly (e.g. controlling output power or relying on calibration), resulting in limited performance (the generated waveform is less close to the desired output voltage waveform), and a less desired ion energy distribution and limited reproducibility (wafer to wafer variation and system to system variation).

US 2018/0032100 describes a waveform generator for a plasma assisted processing apparatus, in which a plurality of bridge legs, each having their own floating DC power source, are connected in a cascaded manner to obtain a switched voltage waveform at an output node. The voltage waveform can include a voltage slope obtained by driving a semiconductor switch according to a current control method such that an output voltage is proportional to a driving signal applied to the semiconductor switch.

U.S. Pat. No. 9,208,992 describes a plasma assisted processing apparatus comprising a switch mode power supply for forming a periodic voltage function at an exposed surface of the substrate to be processed. The periodic voltage function effectuates a desired ion energy intensity distribution to perform etching of the substrate or plasma assisted deposition on the substrate.

The above switch mode power supply can generate a waveform of particular shape with a DC current to compensate for the ion current (see FIG. 14 of U.S. Pat. No. 9,208,992). T$_D$ do so, the switch mode power supply comprises two switch components that are coupled in a half-bridge and are controlled based on drive signals generated by a controller as shown in FIG. 3 of U.S. Pat. No. 9,208,992.

In current plasma assisted processes, there is a tendency towards higher commutation voltage levels, larger reactors sizes, with higher capacitance.

The inherent plasma reactor capacitance and the stray inductance of the interconnection between reactor and bias voltage generator form an LC circuit having an inherent resonance characteristic. Due to the resonance in the system, slow switching speeds (limited dV/dt on the switch node) or a damping resistance (or snubber) are mandatory to suppress excitation of the resonance which would cause undesired ringing of the sheath voltage. This voltage ringing has a negative influence on the desired IED. However, slow switching speeds result in long discharge time periods effectively reducing the process/discharge ratio, which in turn results in a longer time to process the substrate. A too long discharge time can additionally have a negative influence on the sheath formation or preservation of the sheath. Moreover, a damping resistance (or snubber) would cause additional undesired losses.

SUMMARY

It is an aim of the present disclosure to overcome the above drawbacks. It is an aim of the present disclosure to provide a voltage waveform generator for use in plasma assisted processing and related method of generating a voltage waveform, which allows for improved control of the voltage waveform. It is an aim to provide such generator and method allowing for generating a more stable voltage signal with reduced oscillations. IT is an aim to provide such a voltage waveform generator having a reduced footprint.

It is an aim of the present disclosure to provide plasma assisted processing apparatuses and related methods that allow for an improved process control. In particular, it is an aim to provide such apparatuses and methods that enable to approach the ideal or desired voltage waveform more precisely and/or which allow for faster convergence to such ideal waveform.

According to a first aspect of the present disclosure, there is provided a voltage waveform generator as set out in the appended claims. The voltage waveform generator according to aspects of the present disclosure comprises a common node, a voltage waveform generation circuit and a current source. The voltage waveform generation circuit is operably connected to the common node and is configured to apply a voltage signal at the common node. The current source is operably connected to the common node and configured to apply a DC current at the common node, in particular, the DC current is a negative current, i.e. the current source is configured to draw the DC current from the common node.

According to the present disclosure, the current source comprises a first switch node connected to the common node through a first (physical) inductor, and a first power supply connected to the first switch node. The power supply advantageously comprises at least two first voltage nodes, advantageously providing at least two voltage levels, which are advantageously adjustable. The current source is advantageously operable to switch between the at least two first voltage nodes—and hence the at least two voltage levels—at the first switch node.

Such a current source advantageously allows to minimize a ripple on the DC current by appropriate switching between the voltage nodes. In addition, the current source has minimal footprint, and allows for sharing a power source with the voltage waveform generation circuit.

According to a second aspect of the present disclosure, there is provided an apparatus for plasma assisted processing as set out in the appended claims.

According to a third aspect of the present disclosure, there is provided a method of generating a voltage waveform as set out in the appended claims. The methods as described herein are advantageously implemented in the voltage waveform generator, or the apparatus as described herein.

BRIEF DESCRIPTION OF THE DRAWINGS

Aspects of the present disclosure will now be described in more detail with reference to the appended drawings, wherein same reference numerals illustrate same features.

DETAILED DESCRIPTION

Figure 1:
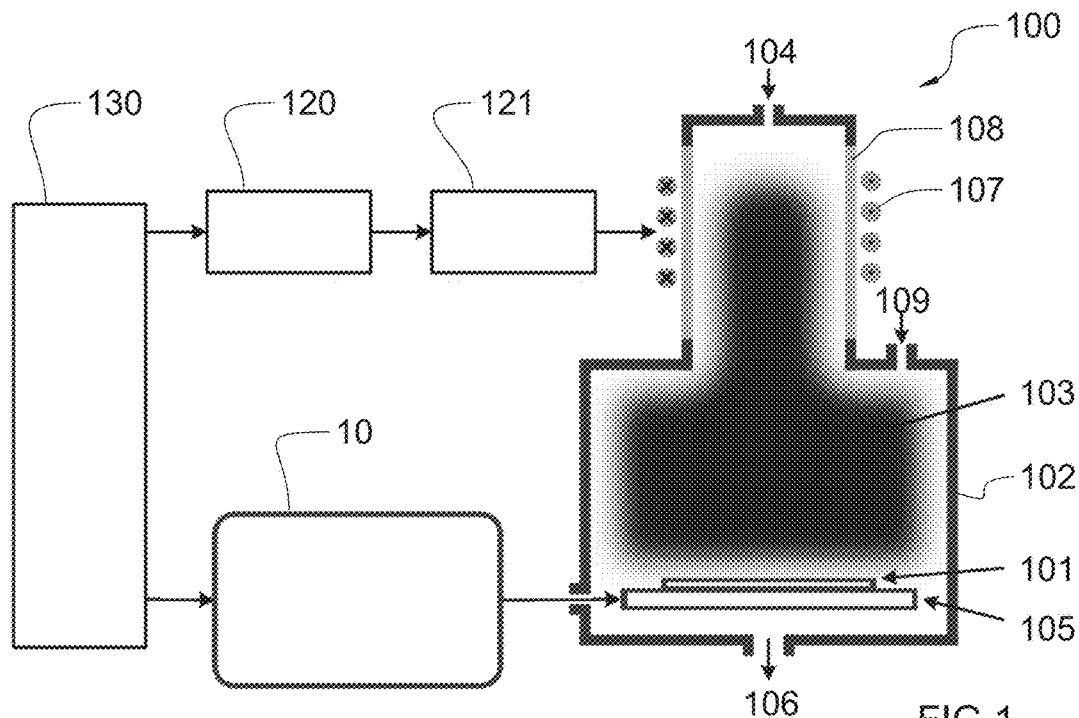
FIG. 1 represents an example of a voltage waveform generator used as bias generator for an ICP (Inductively Coupled Plasma) reactor according to aspects of the present disclosure.

FIG. 1 shows one of the typical usages of a bias voltage waveform generator (BVG) 10 in an Inductively Coupled Plasma (ICP) apparatus 100, where the BVG is controlling the substrate 101 (typically a wafer) voltage by controlling the substrate stage voltage. In a plasma reactor 102, a plasma 103 is generated by introduction of a plasma forming gas 104 in a dielectric tube 108 surrounded by an induction coil 107. The arrangement forms a plasma torch which directs the plasma 103 towards a platform 105 (substrate stage) on which the substrate 101 is positioned. Optionally, a precursor 109 can be introduced in the plasma reactor 102. A radio frequency (RF) voltage is applied to the induction coil 107 through a RF power supply 120, and a matching network 121 as known in the art. The RF power supply 120, as well as the BVG 10 can be controlled through a system host controller 130. Plasma processes suitable for the present disclosure are so called low or reduced pressure plasma, i.e. operating at a pressure significantly below atmospheric pressure, e.g. between 1 mTorr and 10 Torr. To this end, the plasma reactor 102 is advantageously airtight and the desired pressure in plasma reactor 102 is obtained through a vacuum pump 106.

The BVG 10 can also be used in other configurations like a Capacitively Coupled Plasma (CCP) reactor, or a configuration with a direct interconnection (not via the system host controller) of control signals between a source power generator (RF power supply) and BVG. A different source can be used to generate the plasma (e.g. Capacitively Coupled Plasma, Electron Cyclotron Resonance, Magnetron, DC voltage, etc.).

Figure 2:
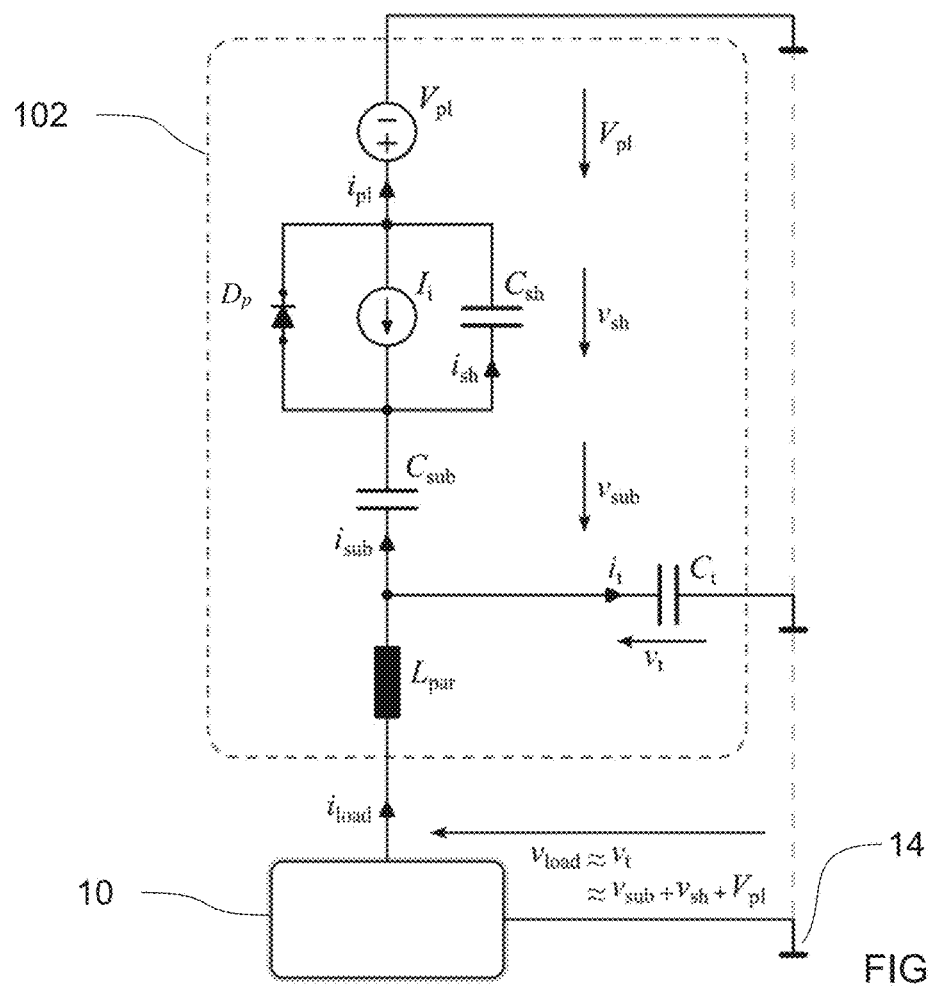
FIG. 2 represents a simplified plasma reactor model and the voltage waveform generator according to the present disclosure coupled to it.

FIG. 2 represents an electrical model of a plasma reactor 102, showing the load posed by the reactor, the plasma, the sheath and the substrate seen by the BVG 10. The sheath is a boundary layer with a greater density of positive ions, and hence an overall excess positive charge, which forms on the exposed surface of the substrate due to the plasma. The excess positive charge typically balances an opposite negative charge on the exposed surface of the substrate with which it is in contact. $V_{pl}$ represents the plasma potential at the sheath above the substrate and $I_i$ the ion current in the sheath. $v_{sh}$ represents the voltage across the sheath. The sheath can be modelled as a sheath capacitance $C_{sh}$ with sheath-capacitance current $i_{sh}$ representing the limited ion mobility in the sheath, during the process period, while the diode $D_P$ represents the high electron mobility in the sheath, during the discharge period. $v_{sub}$ represents the voltage across the substrate 101. Lumped capacitance $C_{sub}$ represents the capacitance of the dielectric substrate. $L_{par}$ is a lumped inductance representing the stray inductance of the BVG output power interconnection and return path. $C_t$ is a lumped capacitance representing the capacitance of the substrate stage (e.g. due to the electrostatic (dielectric) chuck holder on/in the substrate stage) and from the substrate stage power interconnection to earth 14 with associated voltage $v_t$ and current $i_t$. The latter capacitance is usually dominated by the capacitance from the substrate table to the dark shield, i.e. a metal shield adjacent the platform 105 preventing the plasma to propagate beyond the platform, e.g. into pump 106.

A DC (bias) voltage across the sheath ideally results in a narrow IED, with the level of the DC voltage controlling the level of the (average) ion energy. There is a charge build-up on dielectric substrates and/or substrate stages of dielectric material (e.g. electrostatic chuck holders) caused by the positively charged ions that are collected on the plasma-exposed surface. Due to the charge build-up, an (ever-) decreasing voltage would need to be applied by the BVG in order to keep the sheath voltage constant. This is not achievable in a practical implementation. The charge build-up and therefore the potential over the substrate and/or substrate stage needs to be limited to prevent damage of the substrate and/or substrate stage. This compensation can be achieved by a periodic discharge of the substrate and/or substrate stage during a discharge interval between consecutive (plasma) process periods.

Figure 4A:
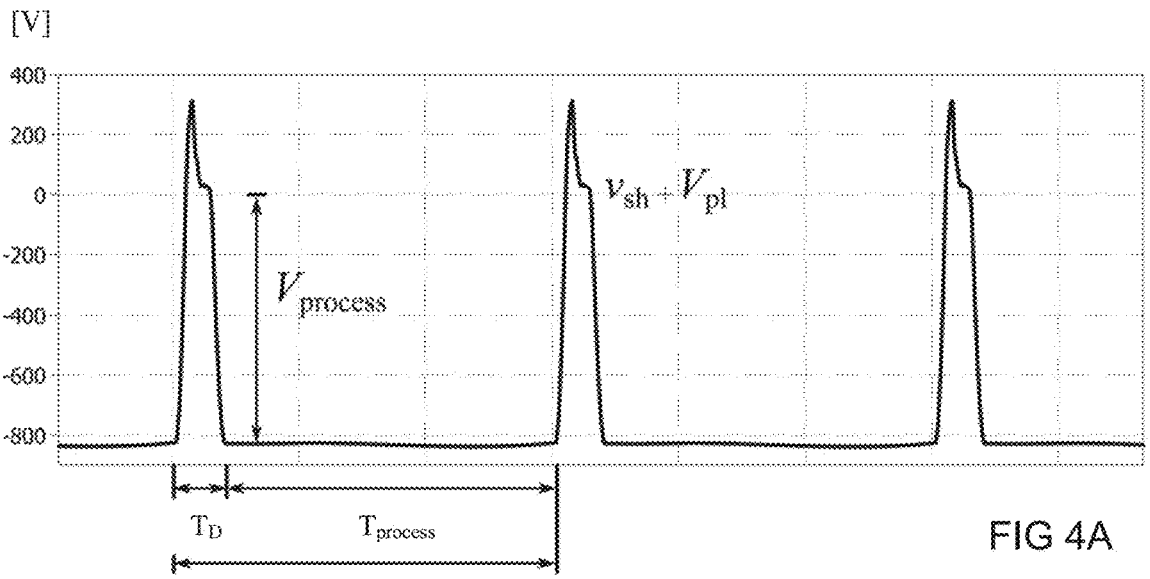
FIG. 4A represents combined plasma voltage and sheath voltage, i.e. the voltage at the exposed substrate surface, during processing and discharge periods.

Referring to FIG. 4A, a process cycle period $T_C$ comprises a plasma processing period $T_{process}$ preceded (or followed) by a discharge period $T_D$. During the plasma processing period $T_{process}$ the sheath voltage $v_{sh}$ and/or the process voltage on the exposed surface of the substrate, $V_{process} = v_{sh} + V_{pl}$ is advantageously (directly or indirectly) controlled and kept constant. Typical values of $V_{process}$ range between 0 V and −1000 V. During the discharge periods $T_D$ between consecutive plasma processing periods $T_{process}$, a positive voltage pulse is applied to the substrate stage allowing removal of electric charge built up on the exposed substrate surface. The discharge period $T_D$ is advantageously as small as possible, typically on the order of 200-500 ns, and the voltage pulse generated during this period advantageously features fast rise and fall times and possibly minimized oscillation of the voltage peak.

Figure 4B:
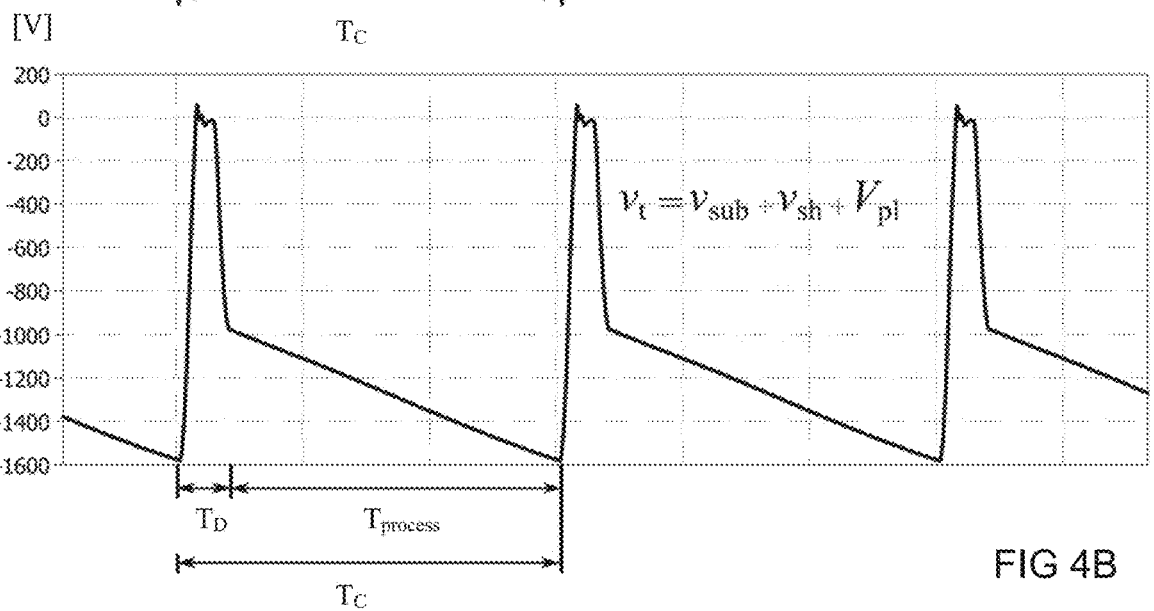
FIG. 4B represents the voltage at the substrate stage during processing and discharge periods, i.e. the voltage provided by the bias generator according to the present disclosure.

The voltage shape described above can be obtained by generating a voltage waveform at the substrate stage, by the BVG 10, as depicted in FIG. 4B. Taking account of the equivalent electric scheme of FIG. 2, a voltage slope must be generated by the BVG during $T_{process}$ to compensate for the charge/voltage build-up across the substrate.

Figure 5A:
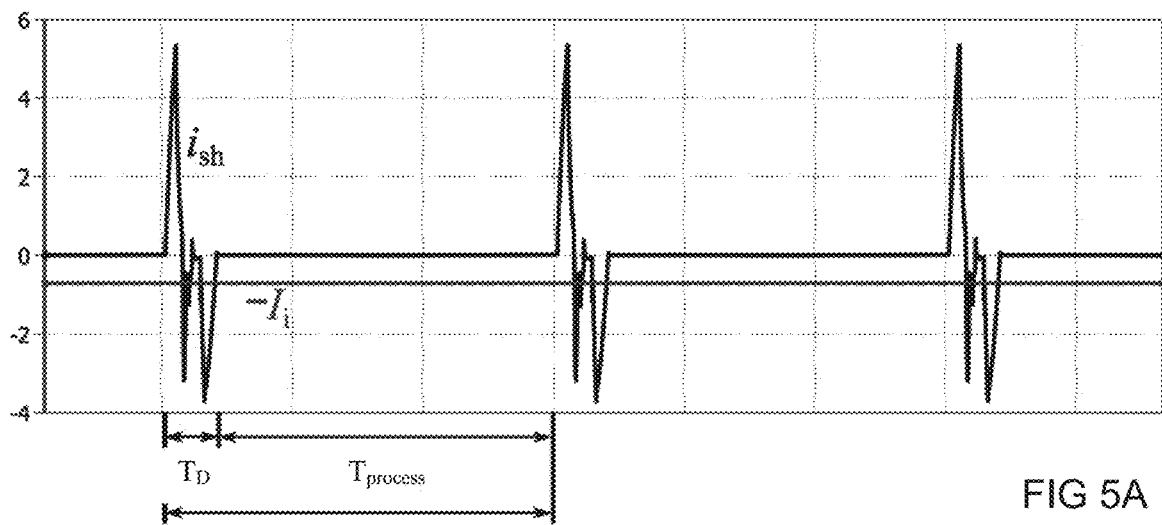
FIG. 5A represents sheath current and ion current during processing and discharge periods.
Figure 5B:
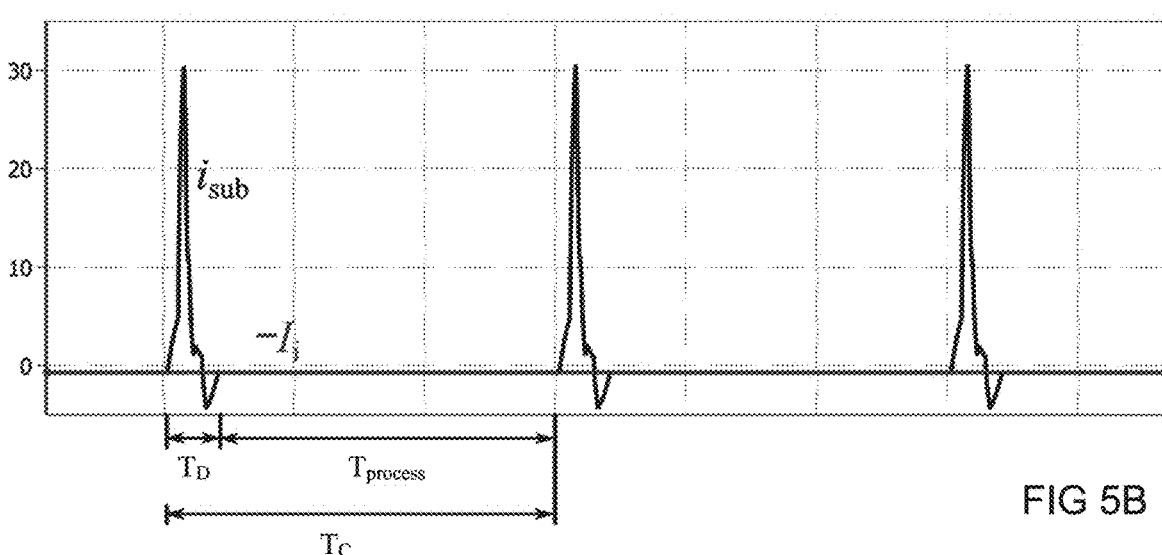
FIG. 5B represents the substrate stage current during processing and discharge periods.
Figure 5C:
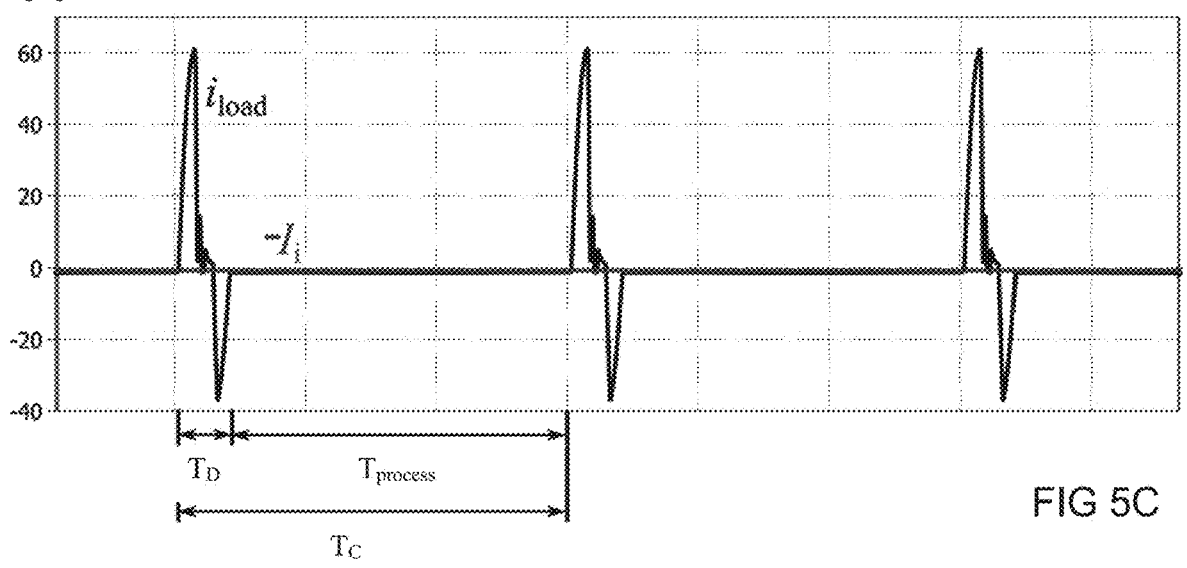
FIG. 5C represents the current supplied by the bias generator according to the present disclosure during processing and discharge periods.

Referring to FIGS. 5A-C, the process currents corresponding to the voltage waveforms of FIG. 4A-B are depicted. It can be seen that the voltage pulse of $T_D$ is accompanied by a current pulse $i_{sh}$ while the plasma current $I_i$ remains substantially constant during the whole cycle period $T_C$, i.e. $i_{sh}=0$ during $T_{process}$. At the substrate, a very high current peak $i_{sub}$ occurs during $T_D$ while ideally $i_{sub}-I_i$ during $T_{process}$. To generate $i_{sub}$, an even higher current pulse $i_{load}$ must be generated by the BVG during $T_D$, while the current $i_{load}$ that must be generated during $T_{process}$ is typically one order of magnitude smaller (between about 0 and 4 A, and in relation to the scheme of FIG. 2, $i_{load}=-I_i(1+C_i/C_{sub})$).

Voltage Waveform Generation Circuit

Figure 3:
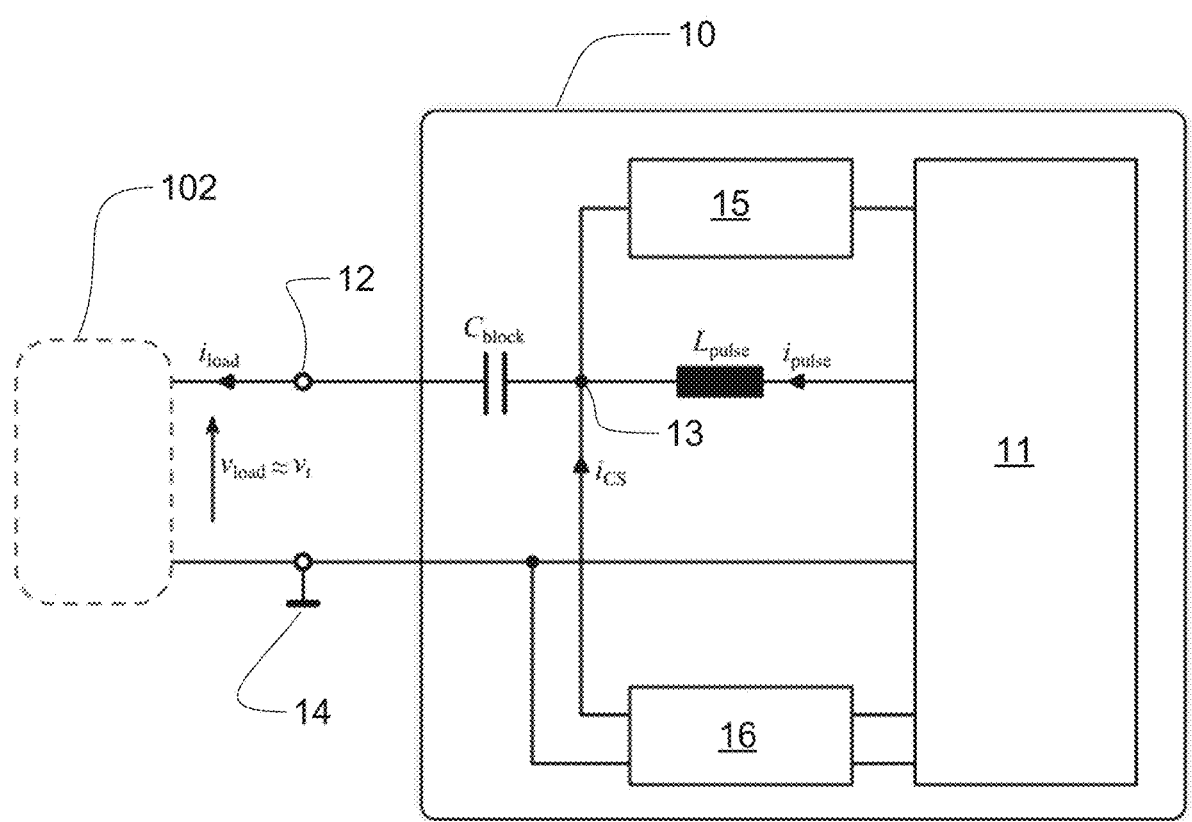
FIG. 3 represents a block diagram of components of the voltage waveform generator according to the present disclosure.

To obtain the desired voltage waveforms described above, according to the present disclosure, a BVG 10 is provided as shown schematically in FIG. 3. BVG 10 comprises a pulse generation circuit 11 and a current source 16 which are coupled to a common node 13. Common node 13 is coupled to the output node 12 of the BVG 10 through an optional physical DC blocking capacitor $C_{block}$.

The pulse generation circuit 11 is configured to generate a voltage pulse during the discharge period $T_D$, which is applied at common node 13, and via DC blocking capacitor $C_{block}$ to the output node 12. An optional voltage clamping circuit 15 can be coupled to the common node 13 to reduce voltage oscillation and/or overshoot at the top plateau of the voltage pulse, as will be described further below. Current source 16 is configured to provide a current $i_{CS}$ to the common node 13 at least during the processing period $T_{process}$, while pulse generation circuit 11 is advantageously inoperative during $T_{process}$. Hence $i_{load}=i_{CS}$ during $T_{process}$ It will be convenient to note that $i_{CS}$ is typically negative (current source 16 sinks current).

According to one aspect, current source 16 operates continuously during the entire cycle $T_C$ to provide $i_{CS}$ to common node 13. In the latter case, $i_{load}=i_{CS}+i_{pulse}$ during the discharge period $T_D$. However, as is evident from the graphs FIGS. 5A-C, $i_{CS}$ (between 0.5 A and 4 A, preferably between 1 A and 2 A) is one order of magnitude smaller than $i_{sub}$. (peak amplitude at least 30 A, advantageously at least 40 A) during $T_D$, and therefore can have negligible influence in the generation of the voltage pulse.

Figure 4C:
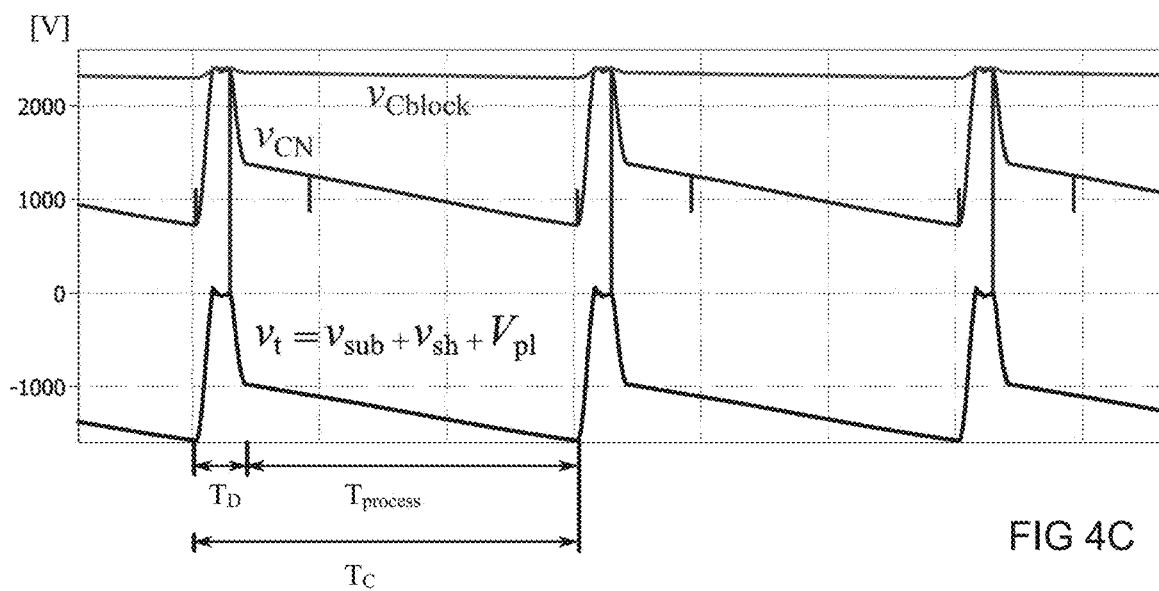
FIG. 4C represents the voltage generated within the bias voltage generator and biased through the DC blocking capacitor, during processing and discharge periods.

Referring to FIG. 4C, the DC-bias voltage $v_{block}$ across the DC blocking capacitor $C_{block}$ allows to set a bias on the voltage at the common node $v_{CN}$.

Figure 6:
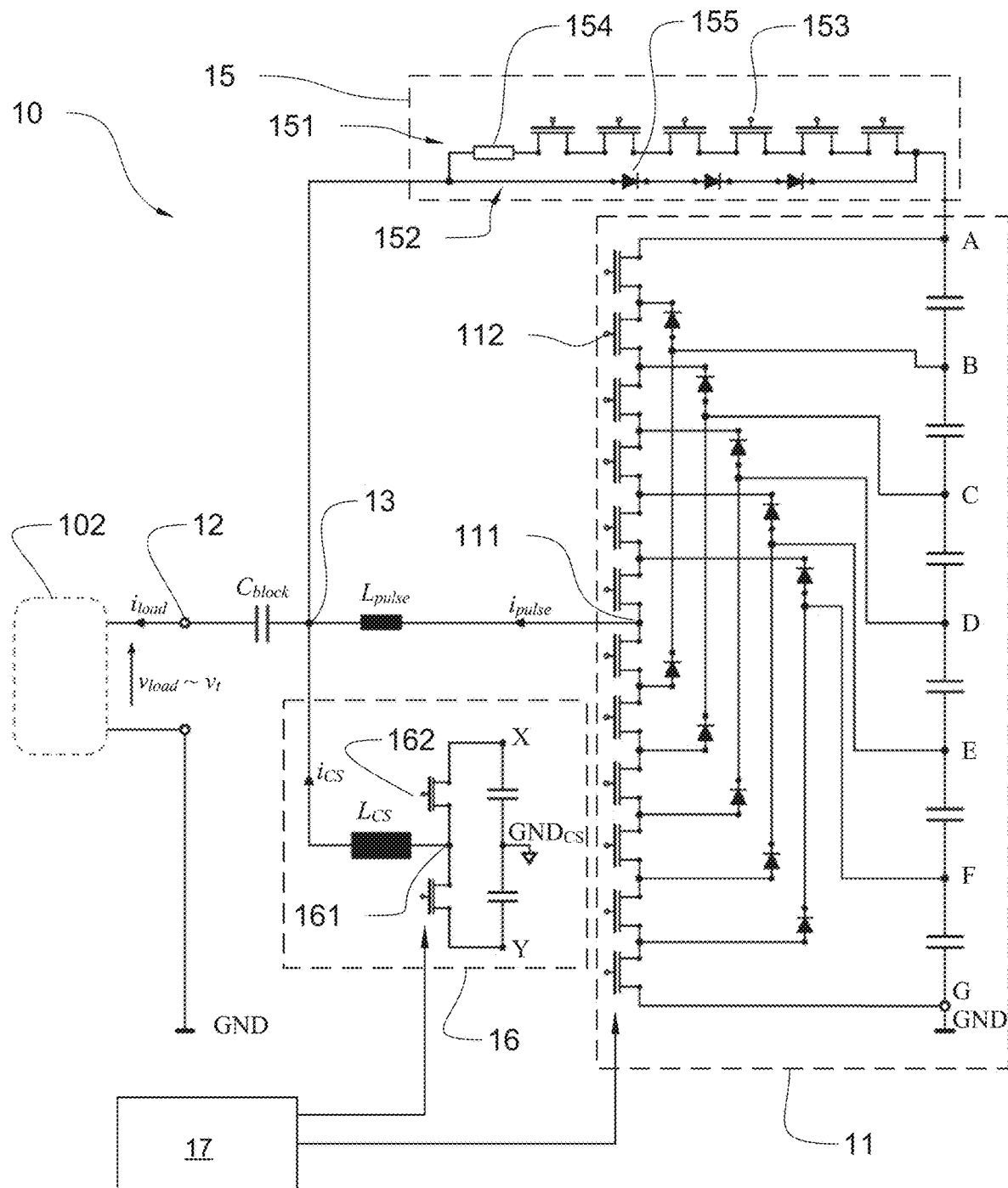
FIG. 6 represents a circuit diagram of a bias voltage generator according to the present disclosure.
Figure 7:
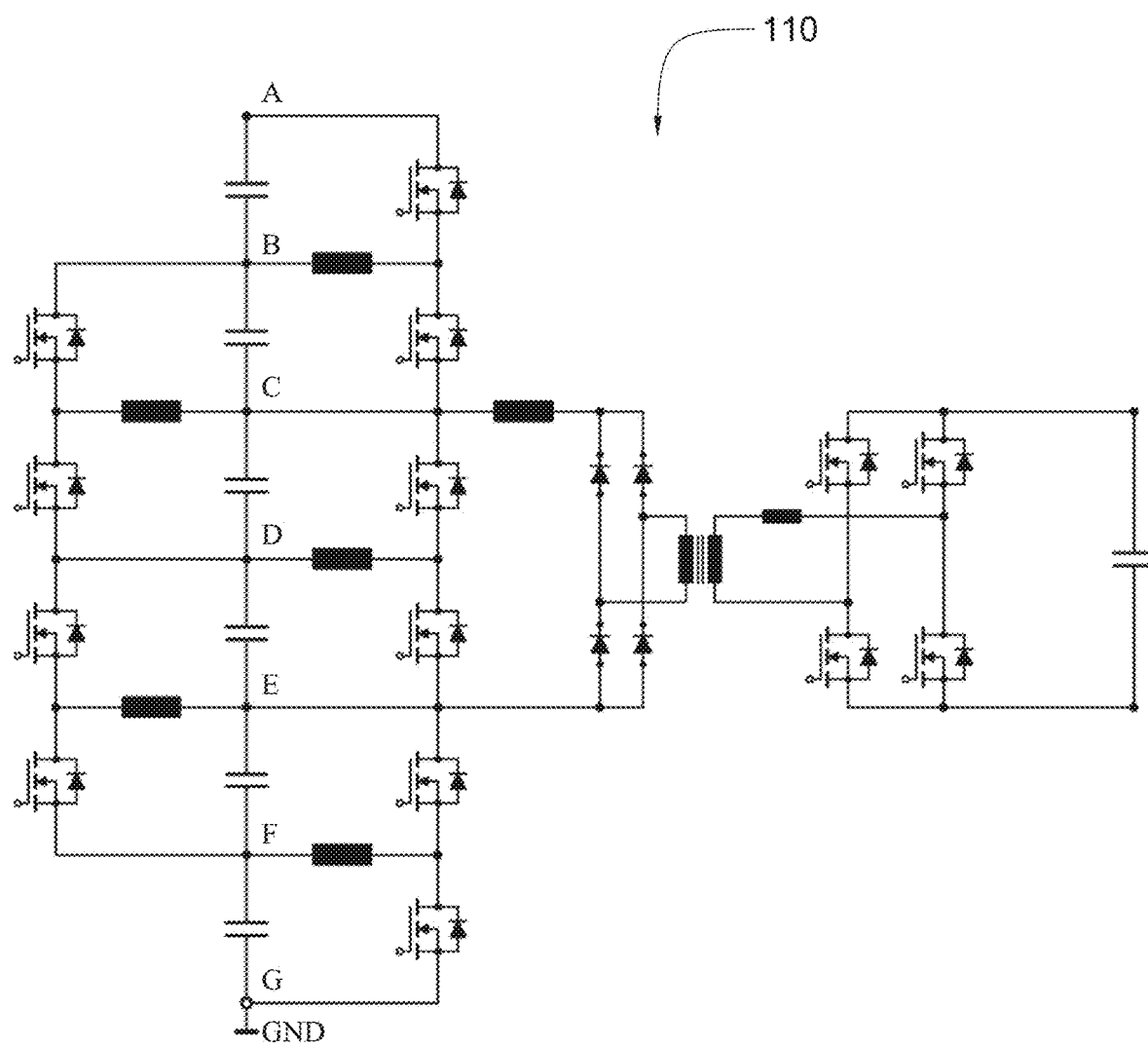
FIG. 7 represents a circuit diagram of a neutral-point-clamped (NPC) electrical converter for use as DC power supply in the pulse generation circuit of the bias voltage generator of FIG. 6.

A circuit diagram of the different parts of the BVG 10 is represented in FIG. 6. In an exemplary embodiment, the pulse generation circuit 11 is a neutral-point-clamped (NPC) bridge circuit comprising active switches 112 connected to a (DC) power supply having at least two (DC) voltage nodes A-G, with G indicating electrical ground GND. The power supply is advantageously provided as a 'rainstick' converter 110, possibly in combination with an (isolated) DC/DC converter, as shown in FIG. 7, providing the at least two voltage nodes A-G (seven voltage nodes in the example of FIG. 7, hence six DC-bus voltages A-B, B-C, C-D, D-E, E-F and F-G). By way of example, each DC-bus voltage A-B, or F-G, etc. can provide for a DC voltage between 100 V and 400 V, advantageously between 200 V and 400 V. Advantageously, the DC-bus voltages A-B, B-C, etc. are controllable by adjusting operation of the active switches of converter 110.

The voltage nodes A-G are connected to a switch node 111 through operable switches 112 of the NPC bridge, and which are operably coupled to a control unit 17. Switches 112 are advantageously semiconductor switches, e.g. provided as Field Effect Transistors (FETs), and advantageously comprise internal anti-parallel diodes (not shown). Switch node 111 is connected to common node 13 via a physical inductor (e.g. a coil) $L_{pulse}$. Inductor $L_{pulse}$ advantageously allows for accurately controlling the current $i_{pulse}$ drawn from pulse generation circuit 11 and substantially reducing or suppressing the influence of the parasitic inductance of the electrical coupling to the substrate stage (represented by $L_{par}$ in FIG. 2) in controlling $i_{pulse}$. Indeed, absent $L_{pulse}$, the current $i_{pulse}$ would be largely defined by the parasitic inductance $L_{par}$, and since the latter is unknown, $i_{pulse}$ would be hard to estimate accurately. Advantageously, $L_{par}$ is relatively smaller compared to $L_{pulse}$. Providing $L_{pulse}$ allows to lower the LC resonance frequency of the equivalent LC circuit seen by the switch node 111, and to increase the load impedance. When a voltage is applied to switch node 111, the current will rise more slowly making it easier to calculate the timings of the voltage pulses applied to the switch node 111 in order to generate a clean discharge pulse.

The voltage clamping circuit 15 provides a switchable connection between the common node 13 and a DC voltage node, in particular a voltage node of a DC power supply, such as voltage node A of power supply 110. To this end, a first branch 151 comprises one active switch or a series arrangement of active switches, e.g. active semiconductor switches 153, to provide for an actively switchable connection between common node 13 and voltage node A. Switches 153 can be operated through control unit 17. The voltage clamping circuit can comprise a second branch 152 in parallel with the first branch 151, which can comprise passive switches, such as one or a series of diodes 155 making the time instant at which active switches 153 are turned on less critical. The voltage clamping circuit 15 can comprise an electrical damping element, such as a resistor 154, advantageously connected in the first branch 151 in series with switches 153, or alternatively in the second branch 152, or in both branches 151 and 152. Resistor 154 allows for reducing/damping voltage oscillations caused by any voltage mismatch when activating the voltage clamping circuit 15.

Current Source Circuit

According to an aspect of the present disclosure, the current source 16 comprises a power supply having at least two voltage levels (nodes) X, Y switchably connected to a switch node 161 through switches 162, which can be active semiconductor switches, such as FETs and which can be operably coupled to control unit 17. Switch node 161 is advantageously connected to the common node 13 via a physical inductor (e.g. a coil) $L_{CS}$. The current source 16 is advantageously provided as a buck converter wherein the duty ratio of switches 162 allows for adjusting a DC voltage at the switch node 161 of the current source. A DC-bus midpoint $GND_{CS}$ between voltage nodes X and Y is advantageously provided. The voltage level of the $GND_{CS}$ is advantageously controlled (e.g. by control unit 17) such that the volt second product across the inductor $L_{CS}$ is minimized. In one example, the (average) DC voltage at switch node 161 in case the duty cycle (duty ratio) of switches 162 is set to 0.5 (50%). In this case, the potentials of X and Y are advantageously symmetric around $GND_{CS}$.

Figure 16:
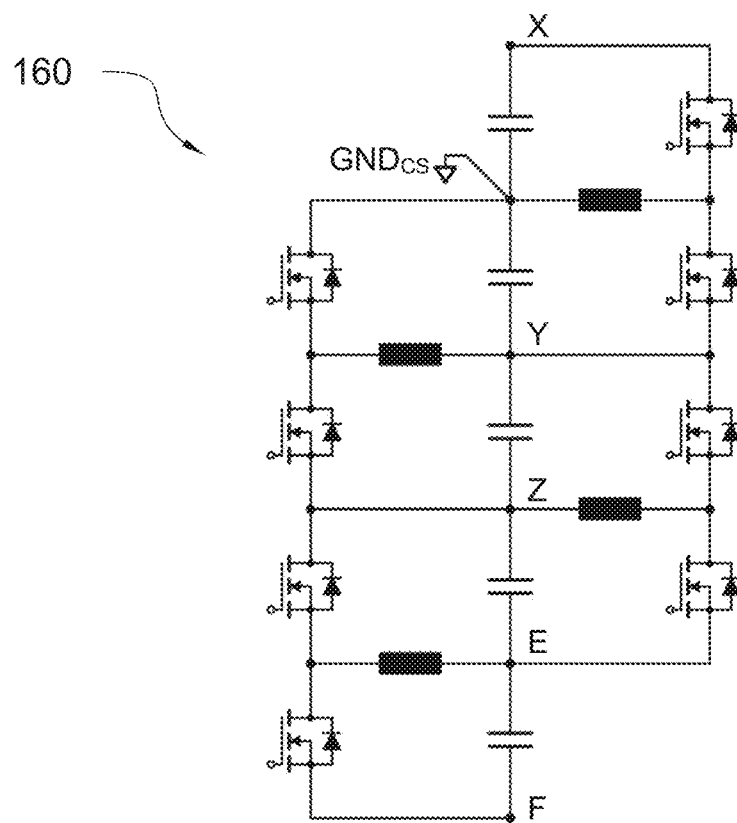
FIG. 16 represents a circuit diagram of a power supply for the current source of the bias voltage generator as described herein, provided as a 'rainstick' DC/DC converter.

Referring to FIG. 16, the power supply of current source 16 can be provided as a so called 'rainstick' DC/DC converter 160 comprising a plurality of voltage nodes X, Y, Z and $GND_{CS}$ realizing a plurality of DC-bus voltages X-$GND_{CS}$, $GND_{CS}$-Y, Y-Z, etc.. The voltages of the DC-busses are advantageously adjustable by appropriate switching of switches of the DC/DC converter 160 and can be set to suitable values, with voltage difference between consecutive nodes advantageously ranging between 100 V and 400 V. The node $GND_{CS}$ acts as a DC-bus midpoint in the buck converter of current source 16 and is interposed between node X and Y. Advantageously, the 'rainstick' DC/DC converters 160 and the 'rainstick' converter of power supply 110 are connected to a shared power supply, in particular the converters/power supplies 160 and 110 share a DC-bus, e.g. DC-bus E-F is shared between the two.

Voltage Waveform (Pulse) Generation

Figure 8:
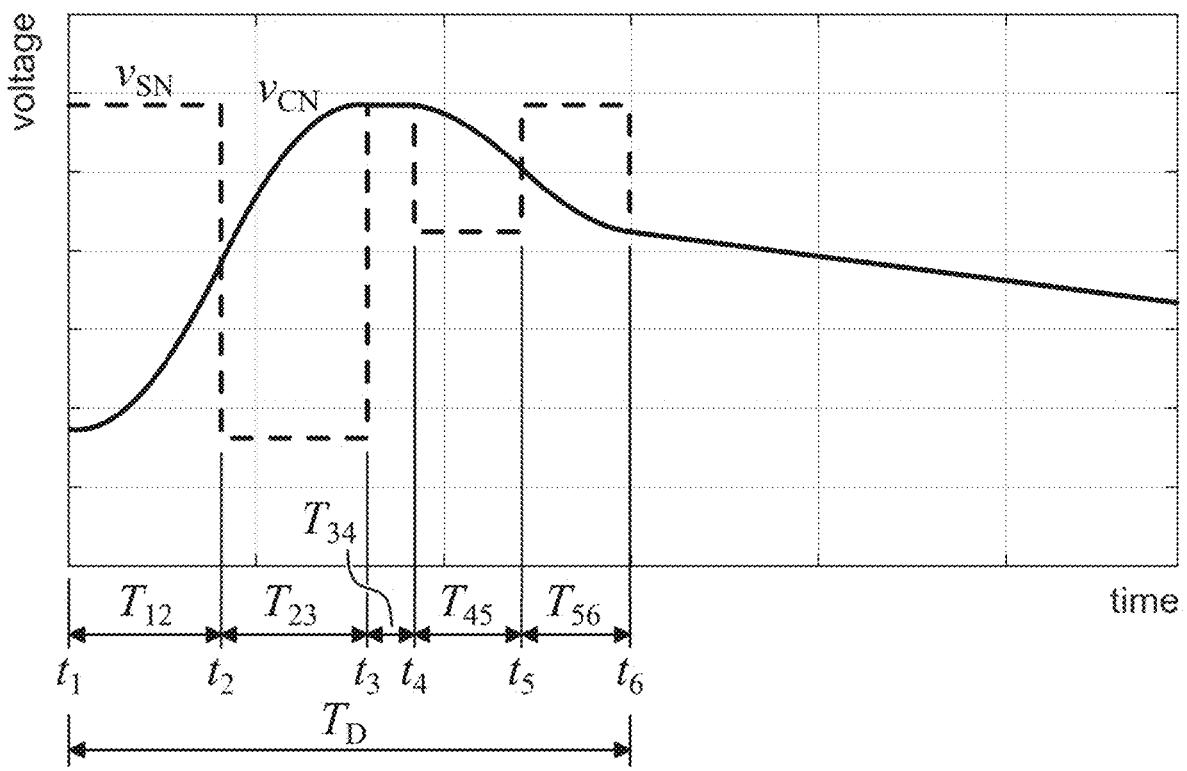
FIG. 8 represents a detail of the voltage waveform of FIG. 4C during a discharge period.
Figure 9:
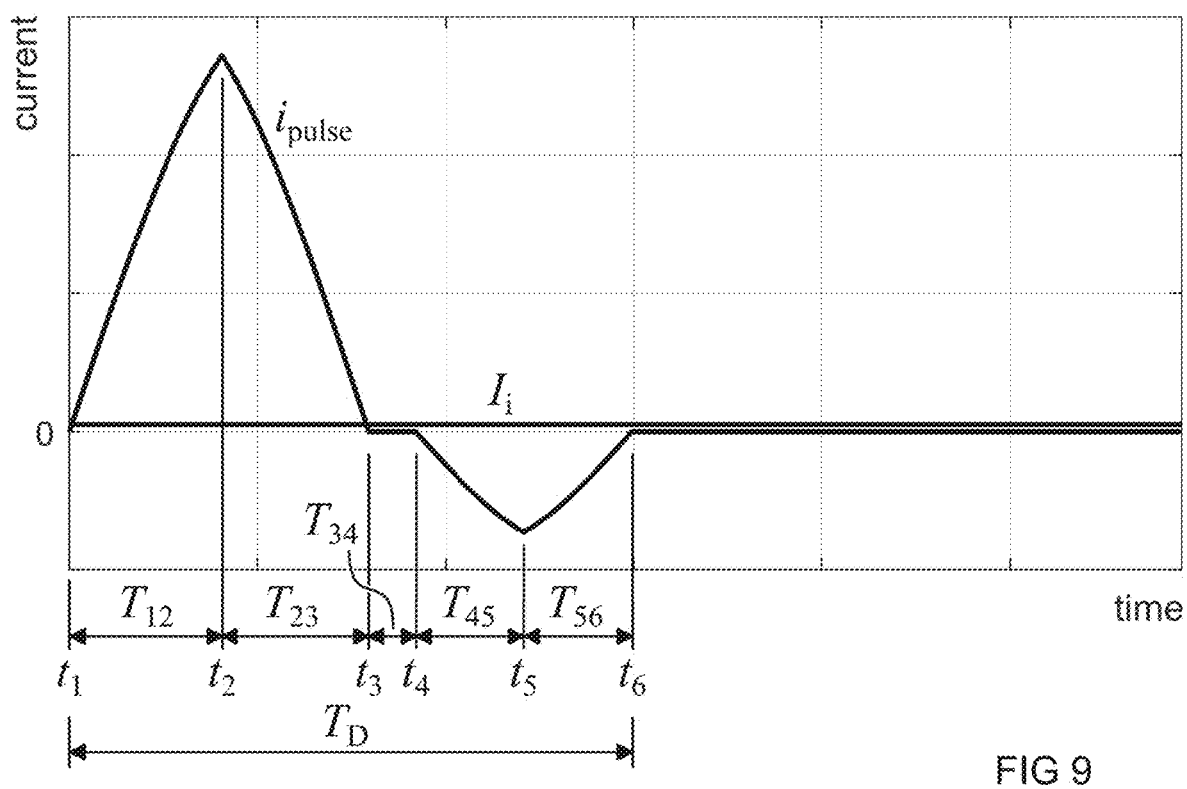
FIG. 9 represents a detail of the current provided by the pulse generation circuit during a discharge period.

The operation of an exemplary embodiment of a pulse generation circuit 11 for generating a voltage pulse during a discharge period $T_D$ will now be described. An enlarged waveform of the voltage pulse $v_{CN}$ generated at the common node 13 during $T_D$ is shown in solid line in FIG. 8. The corresponding current $i_{pulse}$ provided by pulse generation circuit 11 and flowing through inductor $L_{pulse}$ is shown in FIG. 9.

Figure 10:
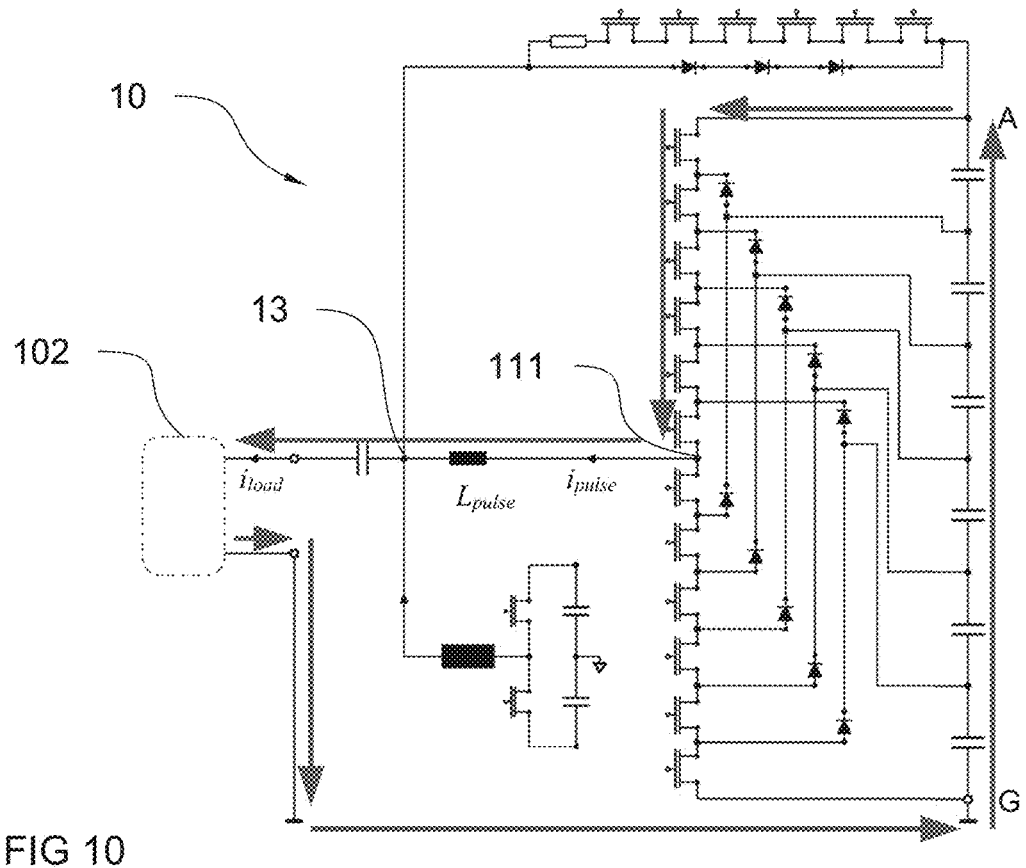
FIG. 10 represents the current flow path through the bias voltage generator during a ramp up period of a voltage discharge pulse causing a current through the inductor coil of the pulse generation circuit to rise.

The voltage pulse comprises a ramp up period $T_{12}$, starting at time instant $t_1$ during which switches 112 are operated, e.g. by control unit 17, to connect a high voltage level, e.g. voltage level at node A, to switch node 111. This is shown in FIG. 8 with the dashed line indicating the voltage $v_{SN}$ at switch node 111. In this case, all switches 112 between switch node 111 and node A are closed, causing a current to flow through the pulse generation circuit as shown by the grey arrows in FIG. 10. The high voltage will cause the current $i_{pulse}$ through $L_{pulse}$ to increase, as shown in FIG. 9. The slope of $i_{pulse}$ is advantageously defined by the inductance of $L_{pulse}$. A smaller inductance value will generally allow a faster ramping up of current and voltage, but will typically result in a higher peak current making switching timing as described above more critical and increasing sensitivity to signal oscillation in case of small mismatch in timing of the switches. A larger inductance value of $L_{pulse}$ will decrease the ramp slope. Therefore, optimal inductance values of $L_{pulse}$ are between 0.5 μH and 10 μH, advantageously between 1 μH and 5 μH.

Figure 11:
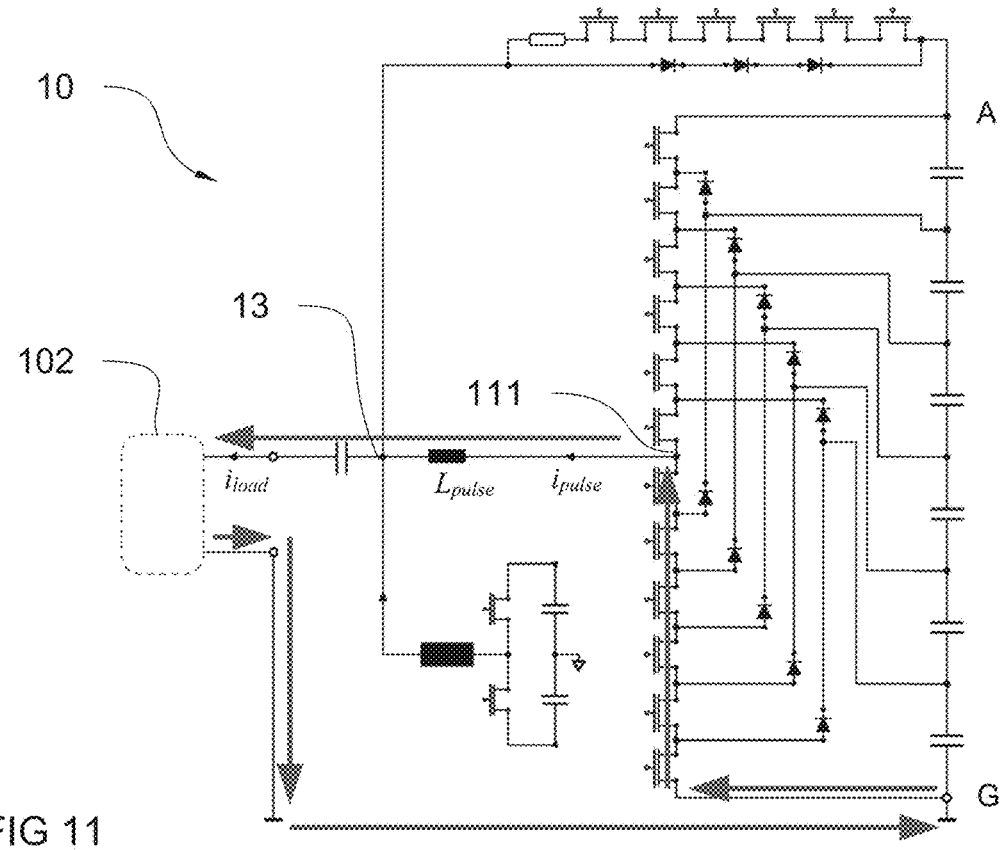
FIG. 11 represents the current flow path through the bias voltage generator during a freewheeling period of a voltage discharge pulse following ramp up causing a current through the inductor coil of the pulse generation circuit to decrease.

At time instant $t_2$, the switches 112 are opened and turn to non-conducting state and all switches 112 are maintained in non-conducting state. This signs the end of ramp up period $T_{12}$ and beginning of a freewheeling period $T_{23}$. Time instant $t_2$ can be selected as the time instant at which the voltage at common node 13 almost reaches the voltage level at switch node 111 (e.g., voltage level of node A). Since the current $i_{pulse}$ through the inductor $L_{pulse}$ must be continuous, a current path is created from electrical ground at node G, through the internal anti-parallel diodes of the switches 112 arranged between node G and switch node 111, as shown by the grey arrows in FIG. 11. The voltage $v_{SN}$ at switch node 111 drops to the voltage level of node G, while the voltage $v_{CN}$ at common node 13 continues to rise somewhat due to the current in inductor $L_{pulse}$ that is still flowing and is ramping down while releasing its energy to the load capacitance, still charging this capacitance. Voltage $v_{CN}$ can eventually reach the level of node A. The current $i_{pulse}$ through inductor $L_{pulse}$ will hence decrease to eventually become zero at time instant $t_3$, signing the end of freewheeling period $T_{23}$.

Figure 12:
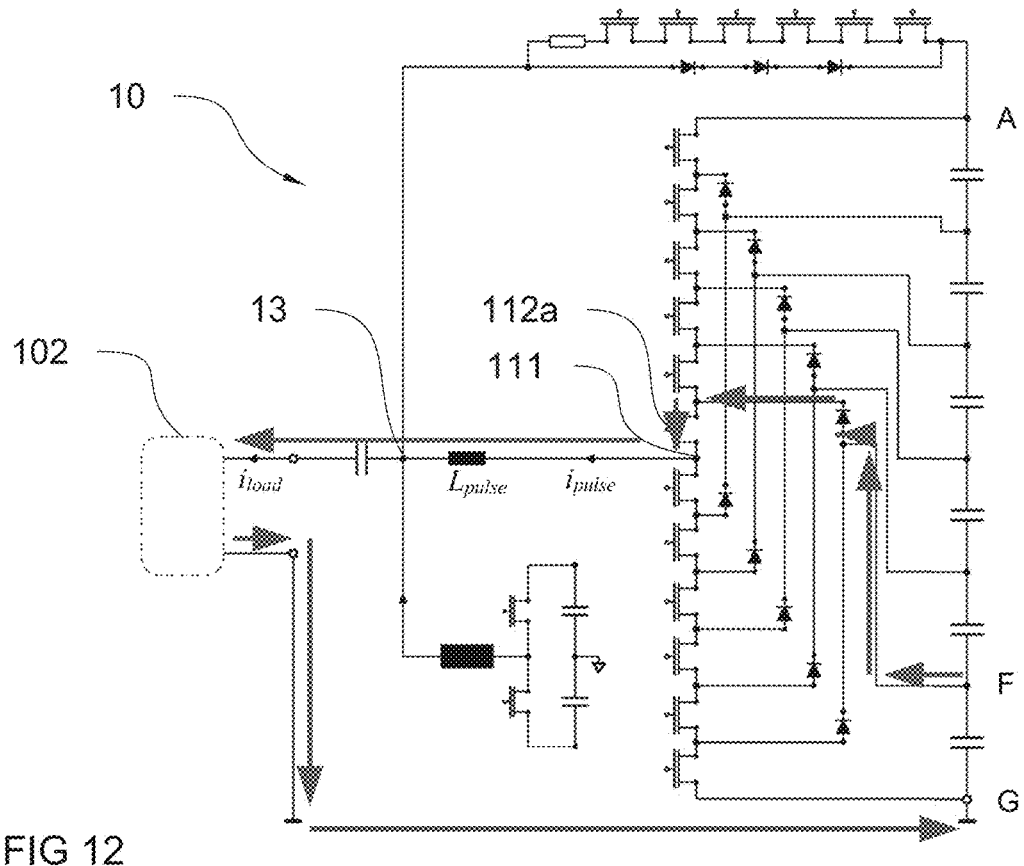
FIG. 12 represents an alternative current flow path through the bias voltage generator during the same freewheeling period as in FIG. 11.

It is alternatively possible to connect switch node 111 to an intermediate voltage level B-F during freewheeling period $T_{23}$. This will alter the falling slope of $i_{pulse}$ and hence have an impact on the slope of the rising edge of the voltage, and therefore a suitable voltage level can be selected based on a desired waveform. The current path is shown in FIG. 12 for the exemplary case in which switch node 111 is connected to voltage node F. In the latter case, switches 112a is actively closed to create the current path through node F.

At time instant $t_3$, the voltage at common node 13 is advantageously clamped to its maximum level, e.g. level of node A, during a clamping period $T_{34}$. The voltage clamping circuit 15 is advantageously used for this purpose. Switches 153, which can be active semiconductor switches, e.g. FETs, are operated by control unit 17 to turn to a conductive state. As a result, the voltage level at common node 13 is clamped to the voltage of node A. Any voltage mismatch between common node 13 and voltage node A at turn-on of the switches 153 is advantageously suppressed by resistor 154. Since the current $i_{pulse}$ through inductor $L_{pulse}$ at time instant $t_3$ was zero, and all switches 112 are maintained in non-conducting state during $T_{34}$, $i_{pulse}$ will remain zero during the entire clamping period $T_{34}$. The length of clamping period $T_{34}$ is advantageously selected based on a desired length $T_D$ of the voltage pulse.

It will be convenient to note that diodes 155 of clamping branch 152 allow clamping the voltage $v_{CN}$ in case it would rise too fast and e.g. reach the level of node A too early, in particular before the current through inductor $L_{pulse}$ becomes zero. This may be the case when a switching timing mismatch occurs.

Figure 13:
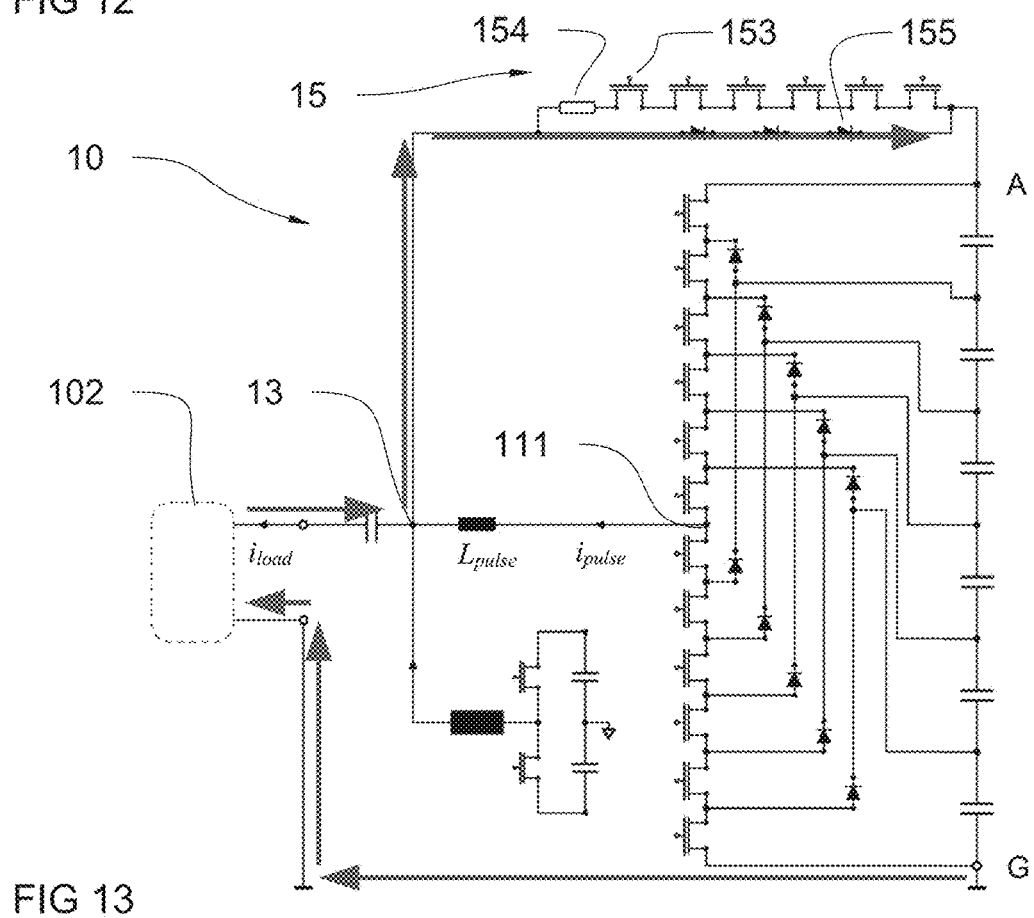
FIG. 13 represents the current flow path through the bias voltage generator during a voltage clamping period of a voltage discharge pulse while no current flows through the inductor coil of the pulse generation circuit.

A possible current path through the BVG during clamping period $T_{34}$ is represented by the grey arrows in FIG. 13. As the voltage level of common node 13 will eventually reach the level of node A at the opposite side of the voltage clamping circuit 15, the diodes 155 may start conducting. At this time, switches 153 can be switched to non-conducting state.

Alternatively, switches 153 can be maintained in conducting state during $T_{34}$. This is particularly relevant if the current source 16 is operating also during the discharge period $T_D$. The switches 153 in that case prevent that the current drawn by the current source 16 would discharge the load capacitance during the clamping interval, causing the voltage of common node 13 to decrease below A. Switches 153 therefore allow to conduct the current drawn by the current source 16 and keep the voltage of common node 13 clamped to the voltage of voltage node A.

It is alternatively possible to dispense with the clamping period $T_3$. In such case, voltage clamping circuit 15 need not be provided.

Advantageously, a clamping diode (not shown) is provided between the common node 13 and voltage node G allowing to limit the magnitude of the voltage spikes as visible in FIG. 4C. These voltage spikes are induced at turn-off (opening) of the switches 153 of the clamping circuit 15, causing the current of the current source 16 to be interrupted. A diode between 13 and G would clamp this voltage spike.

At time instant $t_4$, the ramp down of the voltage pulse is initiated. This signs the end of the clamping period $T_{34}$, and the start of the ramp down period $T_{45}$. To obtain a ramp down, the current $i_{pulse}$ through inductor $L_{pulse}$ is made to become negative. To this end, switch node 111 is connected to a voltage node of DC power supply 110 having a voltage potential which is lower than the (instantaneous) voltage potential of common node 13. In the present exemplary embodiment, since common node is bound to voltage level A due to voltage clamping circuit 15, it will be sufficient to select any one of levels B-G. The level selected will of course have an impact on the slope of the ramp down, and therefore a suitable level can be selected based on a desired waveform.

Figure 14:
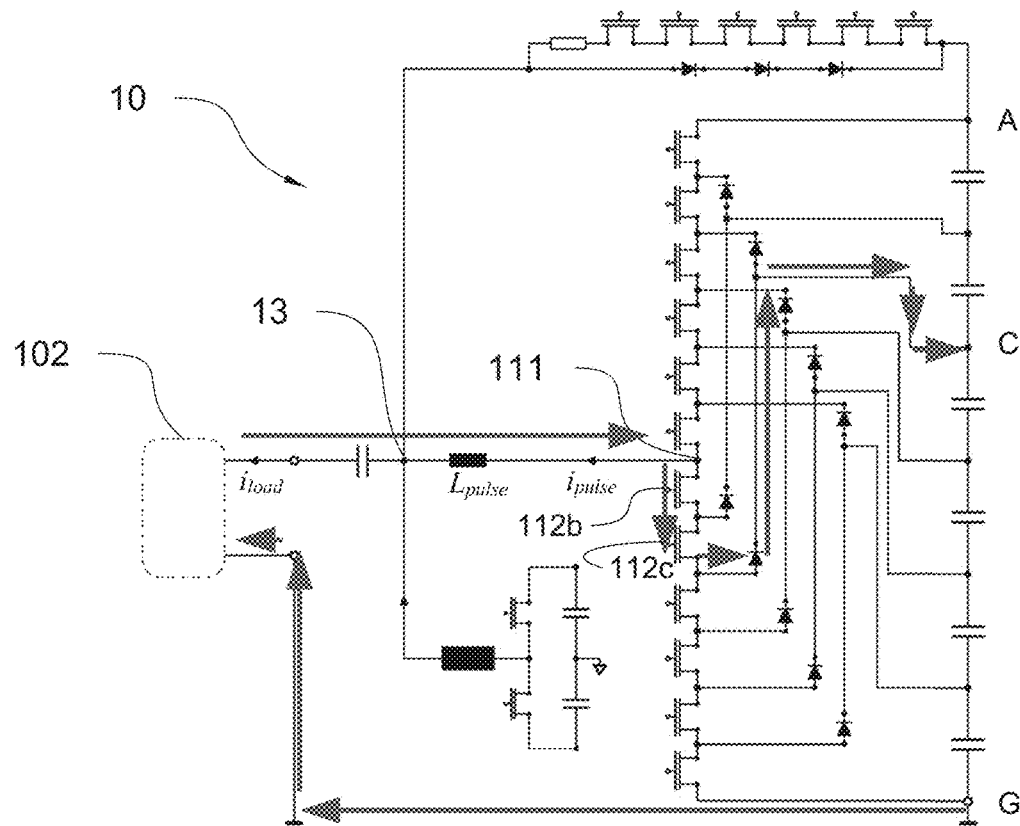
FIG. 14 represents the current flow path through the bias voltage generator during a ramp down period of a voltage discharge pulse causing a reverse current through the inductor coil of the pulse generation circuit to rise.

By way of example, the current path through the BVG 10 during the ramp down period is shown in FIG. 14 for the case that switch node 111 is connected to voltage node C by operating switches 112b and 112c to become conducting. The voltages $v_{CN}$ and $v_{SN}$ during $T_{45}$ are shown in FIG. 8 and the current $i_{pulse}$ through inductor $L_{pulse}$ is shown in FIG. 9.

Figure 15:
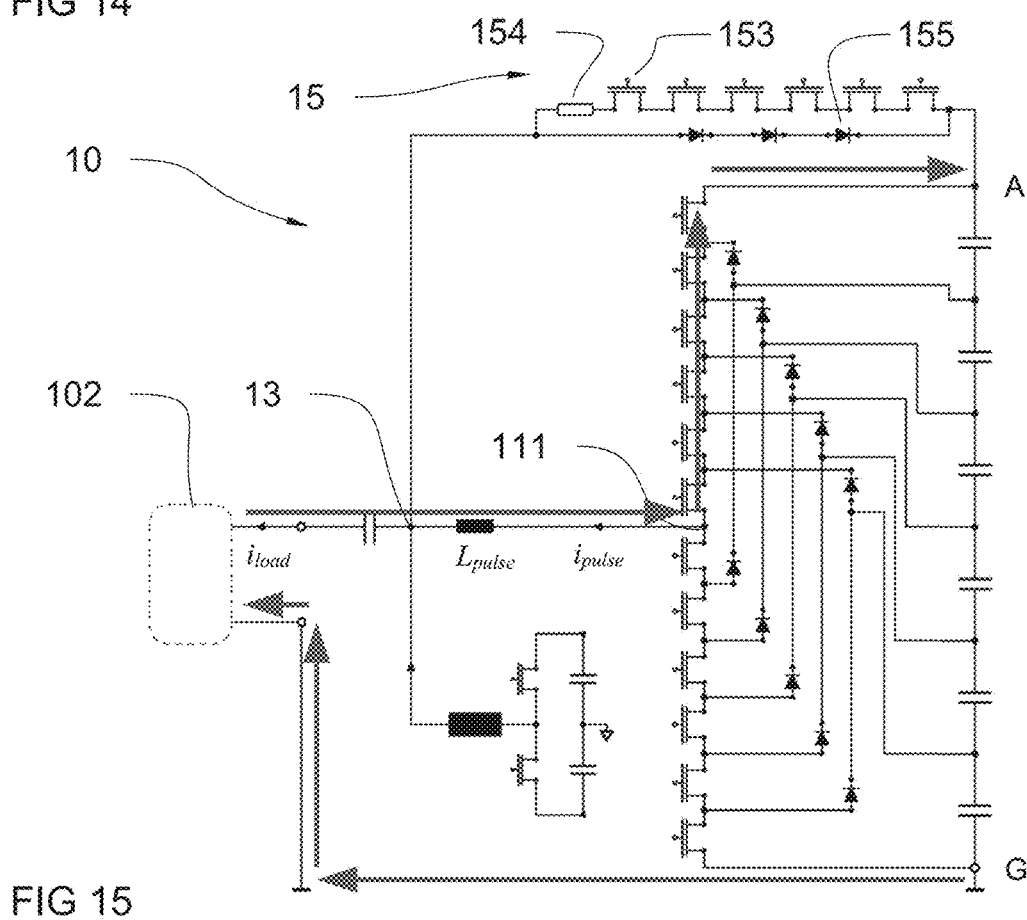
FIG. 15 represents the current flow path through the bias voltage generator during a freewheeling period following ramp down causing the reverse current through the inductor coil of the pulse generation circuit to decrease.

The ramp down period $T_{45}$ is followed by a freewheeling period $T_{56}$ to bring the current $i_{pulse}$ through $L_{pulse}$ back to zero before ending the discharge period (and hence operation of the pulse generation circuit 11) and starting a new processing period $T_{process}$. To this end, at $t_5$ switches 112b and 112c are switched back to the non-conducting state and all of switches 112 remain in non-conducting state (or any other suitable voltage level can be selected). Since $i_{pulse}$ must remain continuous, the inductor $L_{pulse}$ will cause a current to flow between switch node 111 and voltage node A. Switches 112 can be provided with internal anti-parallel diodes, in which case they will conduct this current. Alternatively, external diodes can be provided in anti-parallel with the switches 112. Yet alternatively, other solutions mimicking the operation of such anti-parallel diodes can be used, e.g. switches 112 can be GaN normally-off junction gate field effect transistor (JFET) switches, which allow third quadrant operation, i.e. behaving similarly as diodes in reverse conduction. The resulting current path during $T_{56}$ is represented by the grey arrows in FIG. 15. The internal diodes of switches 112 will automatically turn to non-conducting state once the current $i_{pulse}$ has become zero at time instant $t_6$ (see FIG. 9). This signs the end of a discharge period and the start of a new processing period $T_{process}$.

The time instants $t_1$-$t_6$ and the voltage levels A-G applied to switch node 111 are advantageously selected to maintain a V.s (volt seconds) balance of the inductor $L_{pulse}$. In other words and referring to FIG. 8, the resulting area between curves $v_{CN}$ and $v_{SN}$ should be zero over the time span of $T_D$. This allows for maintaining a steady-state condition/operation in which the average value of the current $i_{pulse}$ in inductor $L_{pulse}$ does not drift away. It will be convenient to note that, when $i_{CS}$ is made to flow continuously over $T_D$, the average value of $i_{pulse}$ over $T_D$ (and $T_C$) is not zero and is related to $i_{CS}$ and thus to $I_i$. It will be convenient to note that additional voltage switching states (periods of $v_{SN}$) can be added, before, after or in between the periods $T_{12}$-$T_{56}$ in order to obtain a desired voltage waveform for $v_{CN}$.

During a process period $T_{process}$, the pulse generation circuit 11 remains inoperative, and no current $i_{pulse}$ flows through inductor $L_{pulse}$. As a result, the voltage over $L_{pulse}$ is zero and the voltage level at switch node 111 will follow the voltage level of the common node 13 during $T_{process}$.

Current Generation

The operation of the current source 16 will now be described. To compensate for the charging of the load capacitance $C_{sub}$ due to $I_i$ a current needs to be sunk from $C_{sub}$ (and hence also from $C_t$). To this end, a voltage slope must be obtained at the common node 13 (and hence at the output node 12) during the process period $T_{process}$, as shown in FIGS. 4B-C. The current source 16 is operated to provide a suitable DC current $i_{CS}$. The current source 16 is advantageously continuously connected to the common node 13 to continuously provide a current $i_{CS}$ during an entire cycle period $T_C$, i.e. both during $T_{process}$ and during $T_D$, since this avoids any distortions that would occur when enabling/disabling or connecting/disconnecting the current source 16, and avoids system complexity related with the measures that would need to be taken to implement a connection/disconnection device/circuitry.

Figure 17:
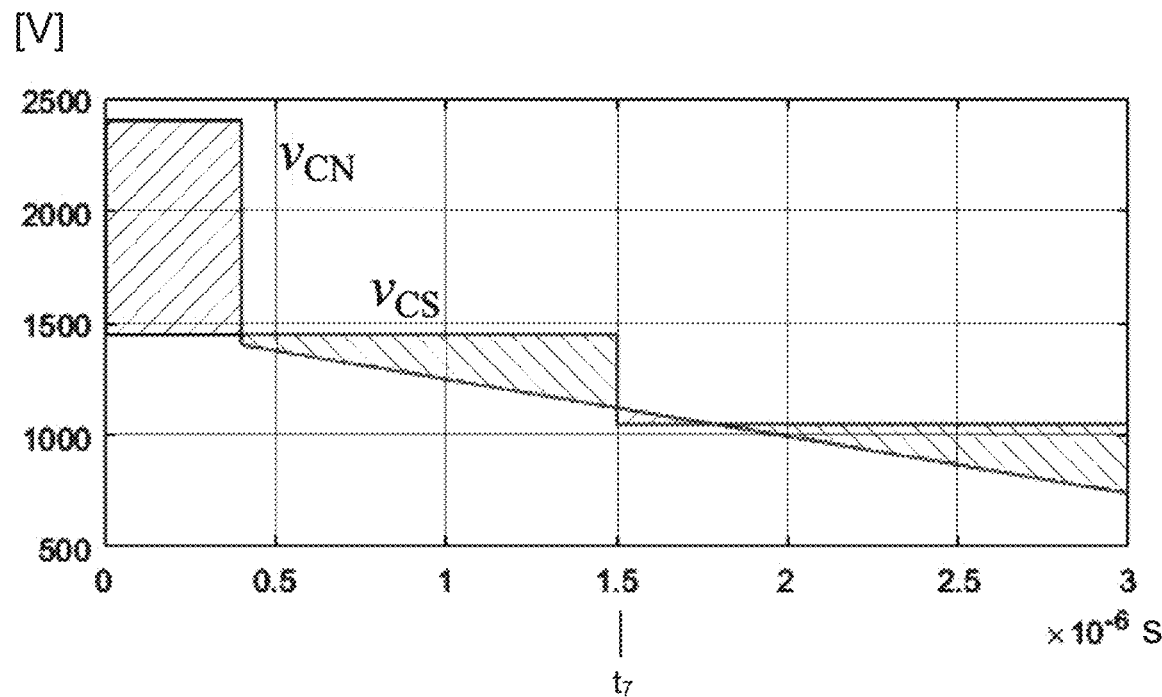
FIG. 17 represents the voltage at the switch node of the current source versus the voltage at the common node of the bias voltage generator as described herein, wherein the current source is switched to obtain a switched voltage at the switch node to minimize the volt seconds across the inductor of the current source.
Figure 18:
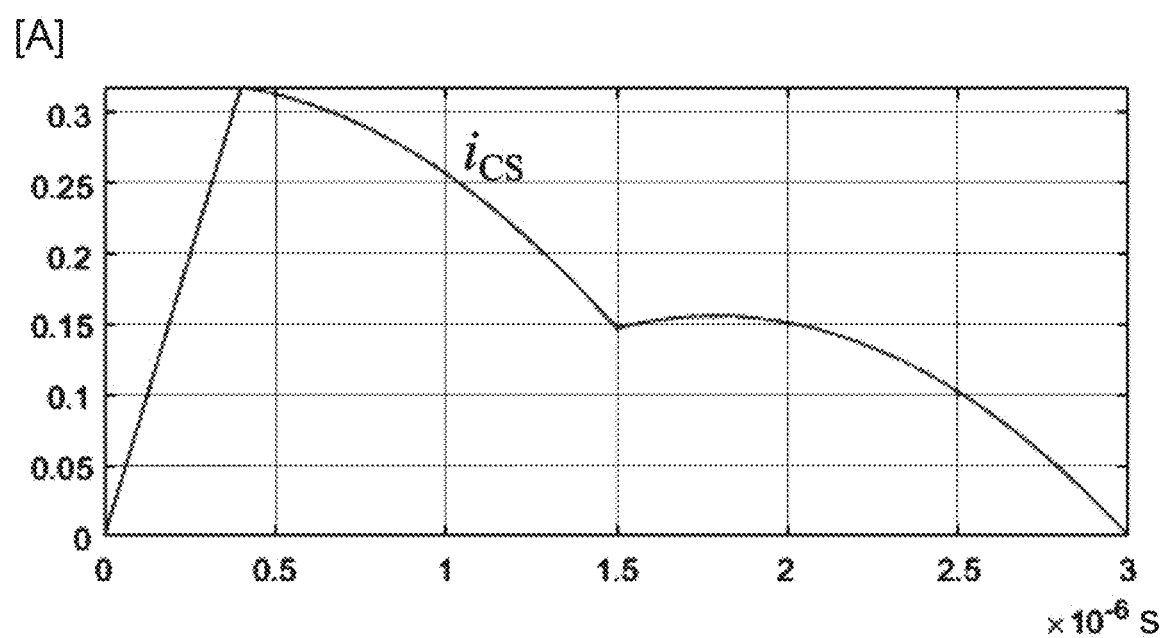
FIG. 18 represents the current ripple on the current through the inductor of the current source associated with the voltage waveforms of FIG. 17.

Referring to FIGS. 17-18, one advantage of the switch node 161 of current source 16 allowing to switch between different voltage levels (of nodes X-Y), is that the current ripple of $i_{CS}$ can be minimized over one period, e.g. one cycle period $T_C$ or one process period $T_{process}$ as the case may be. Switching the voltage $v_{CS}$ of switch node 161 allows for making the volt seconds (V.s) over inductor $L_{CS}$ zero over the given period, as can be seen in FIG. 17, where the hatched areas indicating the difference between the voltage $v_{CN}$ at the common node 13 and the voltage of $v_{CS}$ fully compensate one another over one period. This also means that the average value of $i_{CS}$ will not drift away and a steady-state condition can be achieved. This can be achieved by measuring the average value of $i_{CS}$ (by a current measuring means) and adapting the duty ratio of switches 162 such that the average value of $i_{CS}$ is equal to a predetermined value (which can be implemented by a current control loop implemented in control unit 17). Alternatively, or in addition, the voltage potentials of nodes X and Y can be suitably adjusted. FIG. 17 shows the voltage $v_{CS}$ at switch node 161 is switched at time instant $t_7$ between nodes X and Y.

The current ripple can be reduced by aligning $v_{CS}$ with $v_{CN}$ in a way that all the individual volt-second areas between the curves of $v_{CS}$ and $v_{CN}$ are minimized. Alternatively, or in addition, the voltage levels of X and Y can be adapted to minimize current ripple of $i_{CS}$. This is advantageously performed while maintaining a steady-state condition, i.e. zero net volt-second area or in other words: the average of $v_{CS}$ is equal to the average of $v_{CN}$. A reduced current ripple on $i_{CS}$ advantageously results in a reduced ripple of the sheath voltage.

In another aspect, control unit 17 is configured to synchronize switching of switches 162 of the current source 16 and switches 112 of pulse generation circuit 11, advantageously both in frequency and phase. This can be achieved by implementing a same clock for operating the switches 162 and 112 within control unit 17. This allows for synchronizing the voltage switches of switch node 161 of the current source with the voltage switches of switch node 111 of the pulse generation circuit. As a result, the volt seconds of inductor $L_{CS}$ can be made zero over a given period with greater ease, and avoiding any possible mismatch due to non-synchronous clocks. By so doing, a smaller inductor coil $L_{CS}$ can be used, making the circuit more compact. Additionally, a smaller current ripple on $i_{CS}$ is obtained. Advantageously, the inductance of $L_{CS}$ is between 500 µH and 1 mH. Advantageously, the switching frequency of switches 162 is between 1 kHz and 10 MHz, in particular between 10 kHz and 1 MHz.

The current source 16 can comprise more than two switchable voltage levels allowing to further reduce the current ripple on $i_{CS}$. This way, the voltage at the switch node 161 of the current source can be made to more closely follow the waveform of the voltage $v_{CN}$ of the common node 13. However, this may increase the footprint of the current source circuits and a two-voltage-level circuit (buck converter) can be considered an optimal compromise between performance and footprint.

The current source 16 and possibly pulse generation circuit 11 and/or the voltage clamping circuit 15 can be operated by the control unit 17 through open loop. Alternatively, it may be advantageous to implement a closed loop control in control unit 17 for operating any one of pulse generation circuit 11, voltage clamping circuit 15, and current source 16. To this end, the BVG 10 can comprise measurement devices configured to measure one or a combination of:

the voltage waveform (voltage envelope), which may be measured at common node 13 and/or output node 12;
the voltage level of the common node 13 and/or output node 12 at the start of a discharge period (time instant $t_1$);
the voltage level of the common node 13 and/or output node 12 at the end of a discharge period (time instant $t_6$);
the current $i_{pulse}$ through the inductor $L_{pulse}$;
the current $i_{CS}$ generated by the current source 16 (through inductor $L_{CS}$);
the current through the clamping circuit 15,
one or more voltage levels of the DC bus of power supply 11 and/or 160, and
a process voltage in the plasma chamber 102 (e.g., $v_t$).

Any one of the above measurements can be used in a feedback control loop implemented in control unit 17 to control the operation of the pulse generation circuit and/or the voltage clamping circuit during a discharge period. In addition, or alternatively, these measurements can also be used to control operation of the current source 16, during either one or both a process period and a discharge period.

The invention claimed is:

1. A voltage waveform generator for a plasma assisted processing apparatus, the voltage waveform generator comprising:
   a common node,
   a voltage waveform generation circuit operably connected to the common node and configured to apply a voltage signal at the common node, and
   a current source operably connected to the common node and configured to apply a DC current at the common node,
   wherein the current source comprises:
   a first switch node connected to the common node through a first inductor, and
   a first power supply comprising at least two first voltage nodes, connected to the first switch node,
   wherein the current source is operable to switch between the at least two first voltage nodes at the first switch node.

2. The voltage waveform generator of claim 1, wherein the at least two first voltage nodes are connected to the first switch node through first active switches, wherein the voltage waveform generator comprises a control unit configured to control the first active switches so as to minimize a difference between the voltage signal at the common node and a switched voltage at the first switch node over a predetermined period.

3. The voltage waveform generator of claim 1,
   wherein the voltage waveform generation circuit comprises at least two second voltage nodes,
   wherein the voltage waveform generation circuit is configured to switch between the at least two second voltage nodes, and
   wherein the voltage waveform generator comprises a control unit configured to synchronize switching of the current source between the at least two first voltage nodes and switching of the voltage waveform generation circuit between the at least two second voltage node.

4. The voltage waveform generator of claim 3, wherein the control unit is configured to control switching of the current source between the at least two first voltage nodes and switching of the voltage generation circuit between the at least two second voltage nodes based on a same clock signal.

5. The voltage waveform generator of claim 1, further comprising a control unit configured to generate a voltage waveform for a substrate subjected to plasma assisted processing by:
   applying a voltage signal at a common node electrically coupled to the substrate, and
   applying a first switched voltage to a first switch node, the first switch node connected to the common node via a first inductor, wherein the first switched voltage causes a DC current to flow through the first inductor.

6. The voltage waveform generator of claim 1, wherein the first power supply is configured to provide at least two first adjustable voltage levels at the at least two first voltage nodes.

7. The voltage waveform generator of claim 1, wherein the first power supply comprises a DC-bus midpoint between the at least two first voltage nodes.

8. The voltage waveform generator of claim 7, wherein the at least two first voltage nodes are two first voltage nodes, the first power supply configured to be operated such that the two first voltage nodes provide voltage levels which are symmetric with respect to the DC-bus midpoint.

9. The voltage waveform generator of claim 1, wherein the first power supply comprises a Rainstick DC/DC converter comprising the at least two first voltage nodes.

10. The voltage waveform generator of claim 1, wherein the first power supply and the voltage waveform generation circuit comprise a shared power source.

11. The voltage waveform generator of claim 1, further comprising an output terminal for connection to the plasma assisted processing apparatus, wherein the common node is connected to the output terminal through a DC current blocking capacitor.

12. The voltage waveform generator of ay claim 1, wherein the current source is configured to draw the DC current from the common node.

13. An apparatus for plasma assisted processing of a substrate, the apparatus comprising:
a plasma reactor for configured to generate a plasma,
a processing platform for supporting the substrate, and
the voltage waveform generator of claim 1,
wherein the common node is electrically connected to the processing platform.

14. A method of generating a voltage waveform for a substrate subjected to plasma assisted processing, the method comprising:
applying a voltage signal at a common node electrically coupled to the substrate, and
applying a first switched voltage to a first switch node, the first switch node connected to the common node via a first inductor, wherein the first switched voltage causes a DC current to flow through the first inductor.

15. The method of claim 14, wherein the first switched voltage is obtained by switching between at least two first voltage levels at first time instants, and wherein applying the voltage signal comprises switching between at least two second voltage levels at second time instants, wherein the first and second time instants are synchronized.

16. The method of claim 15, wherein the first and second time instants are timed based on a same clock signal.

17. The method of claim 15, wherein the at least two first voltage levels are adjusted to minimize a difference between the voltage signal at the common node and the first switched voltage.

18. The method of claim 5, wherein the first and second time instants are selected to minimize a difference between the voltage signal at the common node and the first switched voltage.

19. The method of claim 14, wherein the first switched voltage is obtained by switching between at least two first voltage levels at first time instants, wherein the first time instants are selected so as to make a volt second of the first inductor zero over a predetermined period.

20. The method of claim 14, wherein the DC current is applied continuously while applying the voltage signal.

* * * * *

UNITED STATES PATENT AND TRADEMARK OFFICE
CERTIFICATE OF CORRECTION

| | |
|---|---|
| PATENT NO. | : 12,136,534 B2 |
| APPLICATION NO. | : 18/005326 |
| DATED | : November 5, 2024 |
| INVENTOR(S) | : Jordi Everts and Noud Slaats |

It is certified that error appears in the above-identified patent and that said Letters Patent is hereby corrected as shown below:

In the Claims

Column 12, Lines 27 - 28, Claim 3, the text "between the at least two second voltage node" should read --between the at least two second voltage nodes--.

Column 13, Line 1, Claim 12, the text "The voltage waveform generator of ay claim 1" should read --The voltage waveform generator of claim 1--.

Column 13, Line 6, Claim 13, the text "a plasma reactor for configured to generate a plasma" should read --a plasma reactor configured to generate a plasma--.

Signed and Sealed this
Tenth Day of December, 2024

Katherine Kelly Vidal
*Director of the United States Patent and Trademark Office*